(12) United States Patent
Hamada

(10) Patent No.: US 6,906,282 B2
(45) Date of Patent: Jun. 14, 2005

(54) LASER PROCESSING APPARATUS, MASK FOR LASER PROCESSING, AND METHOD FOR MAKING THE MASK

(75) Inventor: Shiro Hamada, Hiratsuka (JP)

(73) Assignee: Sumitomo Heavy Industries, Ltd., Tokyo (JP)

( * ) Notice: Subject to any disclaimer, the term of this patent is extended or adjusted under 35 U.S.C. 154(b) by 65 days.

(21) Appl. No.: 10/181,423

(22) PCT Filed: Jan. 9, 2001

(86) PCT No.: PCT/JP01/00039

§ 371 (c)(1),
(2), (4) Date: Jul. 24, 2002

(87) PCT Pub. No.: WO01/54855

PCT Pub. Date: Aug. 2, 2001

(65) Prior Publication Data

US 2003/0000930 A1 Jan. 2, 2003

(30) Foreign Application Priority Data

Jan. 28, 2000 (JP) ........................................ 2000-019505

(51) Int. Cl.[7] .............................................. B23K 26/06
(52) U.S. Cl. ............................... 219/121.73; 219/121.68
(58) Field of Search ........................ 219/121.73, 121.68, 219/121.67, 121.69, 121.85, 121.6

(56) References Cited

U.S. PATENT DOCUMENTS

| | | | | |
|---|---|---|---|---|
| 4,887,283 A | * | 12/1989 | Hosono | ........................ 378/35 |
| 5,313,043 A | | 5/1994 | Yamagishi | |
| 5,887,520 A | * | 3/1999 | Kinoshita | ................. 101/128.4 |
| 6,211,485 B1 | * | 4/2001 | Burgess | ................... 219/121.7 |
| 6,303,196 B1 | * | 10/2001 | Funatsu | ........................ 428/14 |

FOREIGN PATENT DOCUMENTS

| | | |
|---|---|---|
| JP | 64-047551 | 2/1989 |
| JP | 8-76357 | 3/1996 |

* cited by examiner

Primary Examiner—M. Alexandra Elve
(74) Attorney, Agent, or Firm—Squire, Sanders & Dempsey L.L.P.

(57) ABSTRACT

A mask 10 comprises a mask member layer 12 having a laser processing pattern and comprising a metallic material and first and second substrate members 11 and 13 holding the mask member on two faces thereof and comprising a material that transmits laser light.

7 Claims, 3 Drawing Sheets

(a)

(b)

(c)

LASER PROCESSING APPARATUS, MASK FOR LASER PROCESSING, AND METHOD FOR MAKING THE MASK

TECHNICAL FIELD

The present invention relates to a laser processing apparatus for carrying out processing defined by a predetermined processing pattern to a work by irradiating the work with a laser beam from a laser oscillator thorough a mask having the predetermined pattern, to a mask for laser processing, and to a method for making the mask.

BACKGROUND ART

Laser drilling apparatuses for carrying out drilling to a resin layer of printed circuit boards by a laser beam are provided. Nowadays, laser drilling apparatuses for collectively making a plurality of holes also are provided. Referring to FIG. 1, an example thereof will be described. A pulsed laser beam from a $CO_2$ laser oscillator 21 is incident on a homogeneous optical system 22, so that the energy density distribution in the cross-section of the beam becomes homogeneous. The laser beam emerging from the homogeneous optical system 22 is reflected downward by a reflective mirror 23 and is incident on a conversion optical system 24. The laser beam incident on the conversion optical system 24 has a circular or rectangular cross-sectional shape. The conversion optical system 24 converts the circular or rectangular cross-sectional shape into a linear laser beam having a predetermined width W and length L. Thus, the conversion optical system 24 includes a cylindrical lens system 24-1 for defining the width W and a cylindrical lens 24-2 for defining the length L. Such a conversion optical system 24 is well known, the width W being in the range of 0.1 mm to several mm and the length being about several tens of mm.

A mask stage 25 is arranged right below the conversion optical system 24 to drive a mask 26 in one axial direction. The mask 26, as described below, has many holes for defining a processing pattern for a resin layer of a work 27. An imaging lens system 28 is arranged between the mask stage 25 and the work 27. The imaging lens system 28 defines the reduction ratio of the processing pattern of the mask 26 projected onto the work 27. Herein, the reduction ratio is 1:1.

The work 27 is loaded on a work stage 29 that is movable at least in the inverse direction relative to that of the movement of the mask stage 25, along the same axial direction. In particular, the mask stage 25 and the work stage 29 are controlled with a controller, which is not shown in the drawing, so that these move synchronously.

FIG. 2 shows the relationship between the mask 26 and the cross-sectional shape (shown by hatching) of a linear laser beam, which is converted in the conversion optical system 24. The mask 26 has a processing pattern including a plurality of holes 26-1 that are arranged at random or regularly at a given pitch P with respect to the direction of the movement shown by an arrow. In the linear laser beam, the width W is larger than the diameter of the holes 26-1 and the length L is larger than the range of the processing pattern in the width direction of the mask 26.

In FIGS. 1 and 2, the mask 26 moves across the linear laser beam so that a plurality of laser beam components passing through the holes 26-1 lying in one row of the mask 26 reach the work 27 through the imaging lens 28. Since the mask stage 25 and the work stage 29 are controlled so that these move synchronously in the opposite directions along the same axial direction, holes are continuously formed in the work 27 for every row of the processing pattern of the mask 26 in sequence. Of course, the pulse frequency of the laser beam from the $CO_2$ laser oscillator 21 is set so as to be synchronized with the movement corresponding to one pitch of the mask stage 25. For example, the holes 26-1 in the same row are irradiated with the laser beam at least one time or two times, if necessary, depending on the energy intensity of the laser beam. This means that the same region in the work 27 is irradiated with the laser beam at least one time or two times if necessary. As a result, holes are formed in the region irradiated with the laser beam.

In the above example, the laser beam is fixed while the mask stage 25 and the work stage 29 are movable. Alternatively, for the same diameter, distance, and pitch of the holes formed in the work and for a pulse width of the laser beam on the order of microseconds, as shown in FIG. 3, a mask 26' having a row of holes 26-1' is used. In this case, it is not necessary to drive the mask stage during laser irradiation. In other words, the linear laser beam from the conversion optical system 24 is incident on the mask 26', which is always fixed, whereas only the work stage 29 moves in the direction of an arrow in FIG. 3.

Alternatively, the mask 26 may be fixed while the work 27 is irradiated with a linear laser beam that is scanned on the mask 26 in one axial direction by a galvano-scanner. For this case, the galvano-scanner is provided between the conversion optical system 24 and the mask 26. In this case, after the scanning by the galvano-scanner, the work stage 29 moves the subsequent processing region to a scanning region by the galvano-scanner.

In any case, the diameter of the holes formed by the above-mentioned drilling is in the range of about 30 to 300 µm. Assuming that the reduction ratio of the imaging lens system 28 is 1:1, the diameter of the holes 26-1 formed in the mask 26 is also in the range of 30 to 300 µm. The mask 26 is generally formed of a metallic material and the holes have an aspect ratio (ratio of the diameter to the depth of the hole) of about 1. When the diameter of the holes 26-1 is 50 µm, the thickness of the mask 26 is also 50 µm. The same relationship applies to the mask 26' shown in FIG. 3.

However, in the mask having the above-mentioned thickness, an increased density of the holes 26-1 impairs heat dissipation during laser beam irradiation, resulting in the thermal deformation of the mask 26. The deformation of the mask 26 causes the difference of the positions and the distortion of the shape of the holes formed.

Accordingly, an object of the present invention is to provide a mask for laser processing which does not cause thermal deformation during irradiation with a laser beam.

Another object of the present invention is to provide a method for making the mask.

Still another object of the present invention is to provide a laser processing apparatus using the mask.

DISCLOSURE OF INVENTION

A mask for laser processing according to the present invention has a predetermined processing pattern. The mask comprises a mask member having the processing pattern and comprised of a material that reflects laser light and substrate members for holding the mask member on both faces thereof and comprised of a material that transmits the laser light.

The above-mentioned laser light is, for example, infrared light, the mask member comprises one of Au, Cu, Ni, and beryllium-copper, and the substrate members comprise one of Ge, ZnS, and ZnSe.

A laser processing apparatus according to the present invention carries out processing defined by a predetermined processing pattern to a work by irradiating the work with a laser beam from a laser oscillator thorough a mask having the predetermined pattern. The mask also comprises a mask member having the processing pattern and comprised of a material that reflects laser light and substrate members for holding the mask member on both faces thereof and comprised of a material that transmits the laser light.

The above-mentioned laser oscillator is a $CO_2$ laser oscillator, the mask member comprises one of Au, Cu, Ni, and beryllium-copper, and the substrate members comprise one of Ge, ZnS, and ZnSe.

According to the present invention, a method for making a mask for laser processing having a predetermined processing pattern is further provided. The method comprises a first step of forming a material layer comprising a material that reflects laser light on one face of a first substrate member comprising a material that transmits the laser light, a second step of forming the processing pattern in the material layer, and a third step of bonding a second substrate member comprising a material that transmits the laser light to a face, which is not in contact with the first substrate, of the material layer provided with the processing pattern.

The above-mentioned first step is performed by a vacuum evaporation or plating process, and the second step is performed by lithography, etching, or laser processing.

In the third step, high-frequency vibrations are applied to at least one of the assembly of the material layer provided with the processing pattern and the first substrate member and the second substrate member to bond them.

BEST MODE FOR CARRYING OUT THE INVENTION

Figure 4:
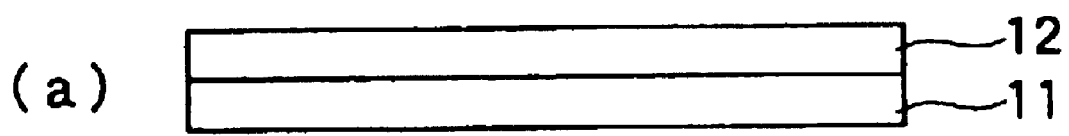
FIG. 4 shows cross-sections illustrating steps of making a mask according to the present invention.
Figure 4:
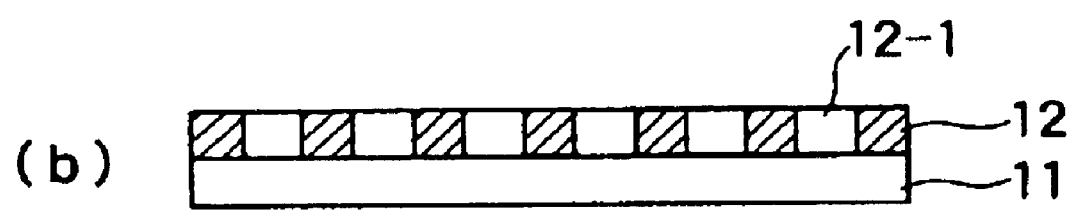
Figure 4:
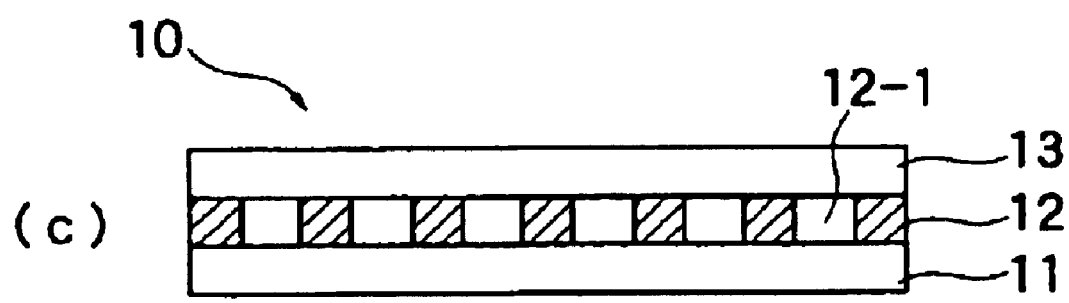

Referring to FIG. 4, a method for making a mask according to a preferred embodiment of the present invention will now be described. Herein, the description will be made in a case that the laser oscillator is the $CO_2$ laser oscillator shown in FIG. 1.

In FIG. 4(a), Au is deposited on one face of a Ge substrate member 11 (first substrate member) having high transmittance for the wavelengths of the $CO_2$ laser beam (9.3 $\mu$m, 9.4 $\mu$m, 10.6 $\mu$m, or the like) to form a mask member layer 12 having a thickness of about 50 $\mu$m, by vacuum evaporation. A plating process may be employed instead of the vacuum evaporation process.

Next, in FIG. 4(b), a plurality of holes 12-1 having a diameter of 50 $\mu$m that define the processing pattern are formed in the mask member layer 12 by a well known combination of lithography and etching or by direct laser processing.

Subsequently, in FIG. 4(c), a substrate member 13 (second substrate membr) is placed onto a face, which is not in contact with the substrate member 11, of the mask member layer 12 to bond them. As a bonding method, at least one of the substrate member 13 and the assembly of the substrate member 11 and the mask member layer 12 is vibrated in a direction parallel to the plane at a high frequency. The mask member layer 12 and the substrate member 13 are bonded to each other by frictional heat generated therebetween.

As a result, a mask 10 that has a plurality of holes 12-1 having a diameter of 50 $\mu$m and an aspect ratio of 1 is obtained. The thickness of the first and second substrates 11 and 13, respectively, is in the range of about several tens of $\mu$m to several hundred $\mu$m.

In the mask member layer 12 of the mask 10, portions corresponding to the holes 12-1 are composed of only Ge and thus have high transmittance for the laser beam. Since Au has high reflectance for the laser beam, the heat absorbed dissipates through the first and second substrates 11 and 13, and the mask 10 is not heated to a high temperature, and therefore no deformation is caused. Furthermore, the first and second substrates 11 and 13 mechanically prevent thermal deformation of the mask member layer 12 therebetween.

Materials for each component of the mask 10 are as follows. Materials for the first and second substrates 11 and 13 include Ge, ZnS (zinc sulfide), and ZnSe (zinc selenide). Materials for the mask member layer 12 include Au, Cu, Ni, and beryllium-copper.

Preferred combinations are Ge—Au, Ge—Cu, and Ge—Ni. In the case of Ge—Au, these are immiscible with each other and form a eutectic alloy. The eutectic composition contains 17 atomic percent Ge and is a low-melting-point alloy having a eutectic point of 356° C.

In the case of Ge—Cu, about 10 atomic percent Ge is dissolved into Cu. In the region containing a larger amount of Ge, various intermetallic compounds are formed. At a Ge content of about 25 atomic percent or more, a eutectic alloy (having a eutectic point of about 640° C.) of $Cu_3Ge$ and Ge is formed.

In the case of Ge—Ni, about 12 atomic percent Ge is dissolved into Ni. In the region containing a larger amount of Ge, various intermetallic compounds are formed. At a Ge content of about 50 atomic percent or more, a eutectic alloy (having a eutectic point of about 780° C.) of NiGe and Ge is formed.

As described above, the Ge—Au system is most preferred because an alloy is readily formed. However, it should be noted that this alloy melts at a low temperature of 356° C. Since Ge and Au readily form a eutectic alloy, a homogeneous structure of Ge and Au exhibits high thermal conductivity. In addition, a small amount of heat generated in Au due to laser beam absorption readily dissipates through the first and second substrates 11 and 13.

Figure 1:
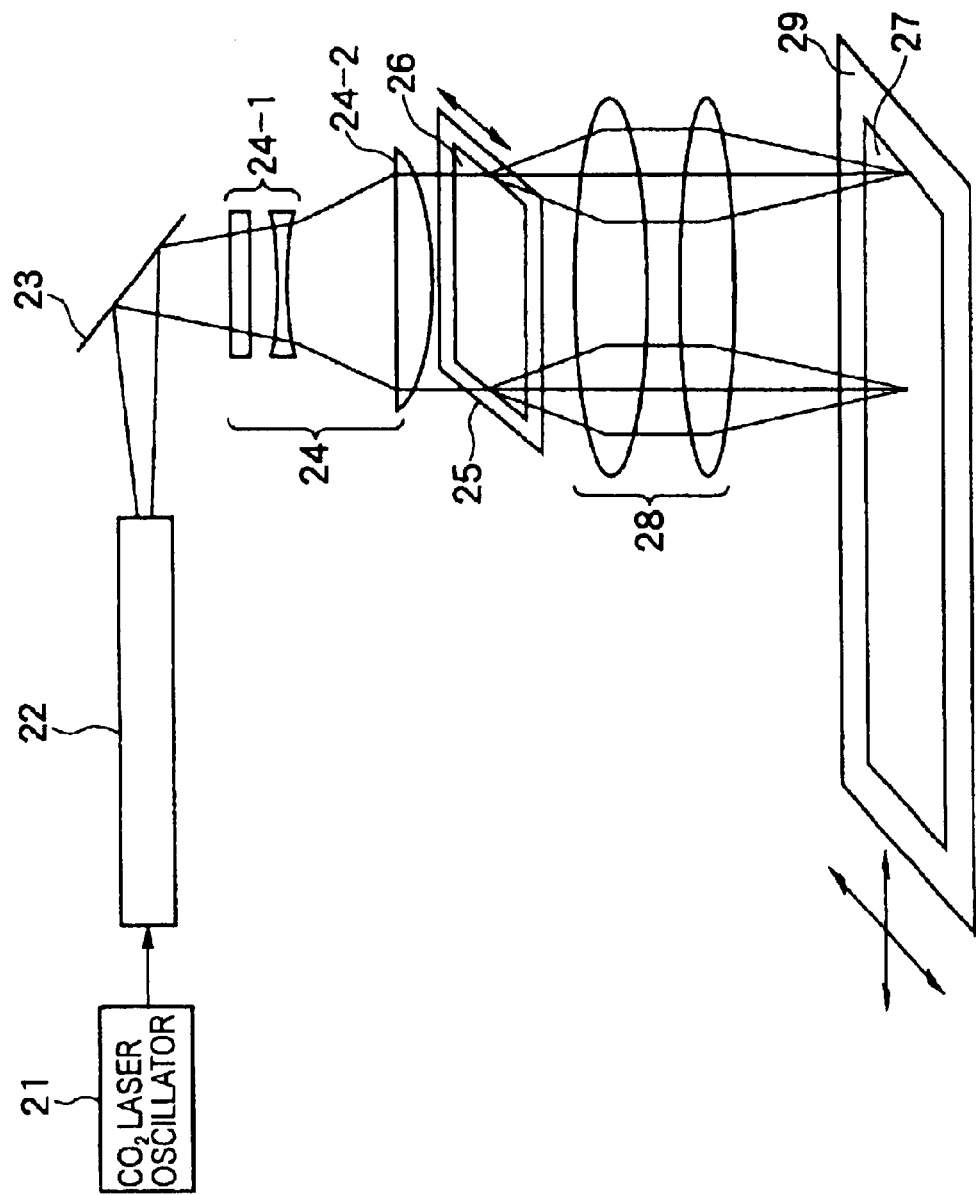
FIG. 1 shows the configuration of a laser processing apparatus used for collectively forming a plurality of holes according to the present invention.
Figure 2:
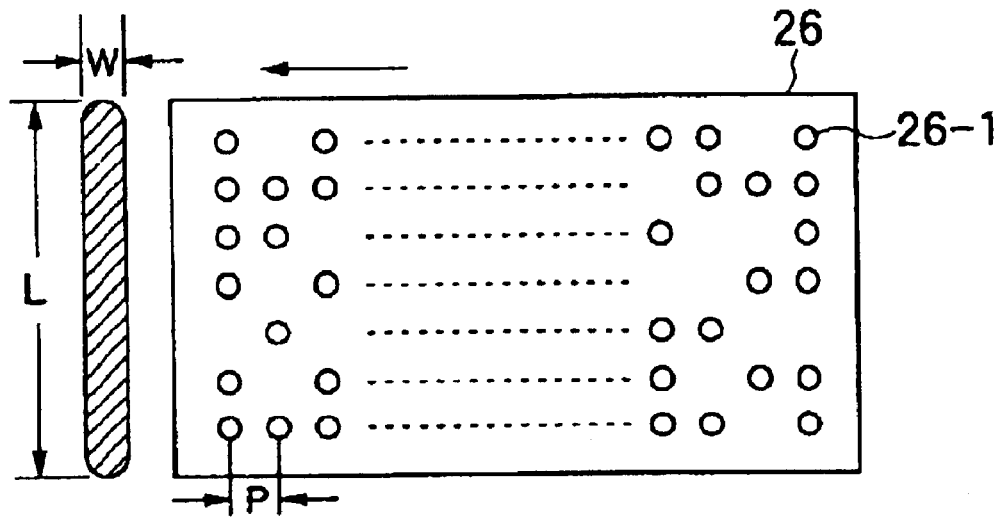
FIG. 2 shows the relationship between a mask used in the laser processing apparatus shown in FIG. 1 and the cross-sectional shape of linear laser light.
Figure 3:
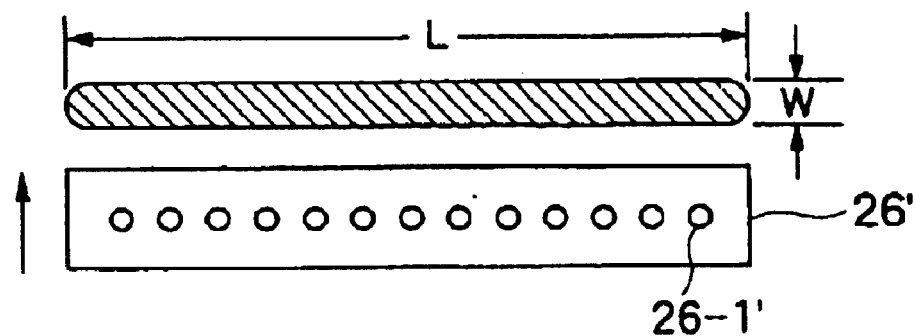
FIG. 3 shows the relationship between another mask and the cross-sectional shape of linear laser light.

The mask according to the above embodiments is suitable for the mask 26 of the laser drilling apparatus for carrying out the drilling to the resin layer of the printed circuit board shown in FIG. 1. However, the mask according to the present invention is not limited to the mask of the laser drilling apparatus. For example, this is also applicable to a mask of a laser distortion processing apparatus that irradiates a plurality of fine ceramic substrates arranged in a row with a plurality of laser beams to impart microdistorsion to each ceramic substrate.

The laser oscillator is not limited to the $CO_2$ laser oscillator. Other laser oscillators, for example, a YAG laser oscillator and a YLF laser oscillator can also be used. Materials for the first and second substrate and the mask member layer may be selected depending on the laser oscillator.

According to the present invention, the first and second substrates dissipate heat from the mask member layer and mechanically fix the mask member layer; hence, the resulting mask for laser drilling does not undergo thermal deformation due to irradiation with laser light.

INDUSTRIAL APPLICABILITY

As described above, the mask according to the present invention is suitable for a mask of a laser drilling apparatus for carrying out the drilling to a work and a mask of a laser distortion processing apparatus for imparting distortion to a work.

What is claimed is:

1. A mask for laser processing having a predetermined processing pattern, the mask comprising a mask member having the processing pattern and comprised of a material that reflects laser light and substrate members for holding the mask member on both faces thereof and comprised of a material that transmits the laser light, the mask member comprises one of Au, Cu, Ni, and beryllium-copper.

2. The mask for laser processing according to claim 1, wherein the laser light is infrared light, and the substrate members comprise one of Ge, ZnS, and ZnSe.

3. A laser processing apparatus for carrying out processing defined by a predetermined processing pattern to a work by irradiating the work with a laser beam from a laser oscillator thorough a mask having the predetermined pattern, wherein the mask comprises:

a mask member having the processing pattern and comprised of a material that reflects laser light and substrate members for holding the mask member on both faces thereof and comprised of a material that transmits the laser light, the mask member comprises one of Au, Cu, Ni, and beryllium-copper.

4. The laser processing apparatus according to claim 3, wherein the laser oscillator is a $CO_2$ laser oscillator and the substrate members comprise one of Ge, ZnS, and ZnSe.

5. A method for making a mask for laser processing having a predetermined processing pattern, the method comprising:

a first step of forming a material layer comprising a material that reflects laser light on one face of a first substrate member comprising a material that transmits the laser light;

a second step of forming the processing pattern in the material layer; and a third step of bonding a second substrate member comprising a material that transmits the laser light to a face, which is not in contact with the first substrate, of the material layer provided with the processing pattern, the reflecting material comprises one of Au, Cu, Ni, and beryllium-copper.

6. The method for making a mask for laser processing according to claim 5, wherein the first step is performed by a vacuum evaporation or plating process, and the second step is performed by lithography, etching, or laser processing.

7. A method for making a mask for laser processing having a predetermined processing pattern, the method comprising a first step of forming a material layer comprising a material that reflects laser light on one face of a first substrate member comprising a material that transmits the laser light; a second step of forming the processing pattern in the material layer; and a third step of bonding a second substrate member comprising a material that transmits the laser light to a face, which is not in contact with the first substrate, of the material layer provided with the processing pattern, wherein, in the third step, high-frequency vibrations are applied to at least one of the assembly of the material layer provided with the processing pattern and the first substrate member and the second substrate member to bond them.

* * * * *